United States Patent
Hu et al.

(10) Patent No.: US 11,946,981 B2
(45) Date of Patent: Apr. 2, 2024

(54) CABLE SEQUENCE DETECTION METHOD AND DETECTION SYSTEM

(71) Applicant: HUAWEI TECHNOLOGIES CO., LTD., Shenzhen (CN)

(72) Inventors: Jian Hu, Xi'an (CN); Jinjun Yu, Xi'an (CN); Hu Zhao, Dongguan (CN); Yongding Zhang, Nanjing (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 198 days.

(21) Appl. No.: 17/702,949

(22) Filed: Mar. 24, 2022

(65) Prior Publication Data

US 2022/0214407 A1    Jul. 7, 2022

Related U.S. Application Data

(63) Continuation of application No. PCT/CN2019/107864, filed on Sep. 25, 2019.

(51) Int. Cl.
*G01R 31/58* (2020.01)
*H01Q 1/24* (2006.01)
*H04B 17/12* (2015.01)

(52) U.S. Cl.
CPC ............. *G01R 31/58* (2020.01); *H01Q 1/246* (2013.01); *H04B 17/12* (2015.01)

(58) Field of Classification Search
CPC . G01R 23/10; G01R 25/08; G01R 31/318527
See application file for complete search history.

(56) References Cited

U.S. PATENT DOCUMENTS

| 7,324,837 | B2 * | 1/2008 | Yamakita | H04B 7/0608 |
|---|---|---|---|---|
| | | | | 455/562.1 |
| 9,209,853 | B1 * | 12/2015 | Nohalty | H04B 1/401 |

FOREIGN PATENT DOCUMENTS

| CN | 1545362 A | 11/2004 |
|---|---|---|
| CN | 101207836 A | 6/2008 |
| CN | 101340687 A | 1/2009 |
| CN | 101741418 A | 6/2010 |
| CN | 101989872 A | 3/2011 |
| CN | 203607549 U | 5/2014 |
| CN | 104581793 A | 4/2015 |
| CN | 205450123 U | 8/2016 |
| CN | 106330345 A | 1/2017 |
| CN | 109560824 A | 4/2019 |

(Continued)

*Primary Examiner* — Tung X Nguyen
(74) *Attorney, Agent, or Firm* — Maier & Maier, PLLC (57) ABSTRACT

A cable sequence detection method and a detection system. A base station antenna includes N ports, an RRU includes M antenna ports and one calibration port, any port i of the base station antenna corresponds to a directional coupling branch Ti, and a switch circuit Ki whose connection and disconnection are controlled by an RCU is disposed on the Ti. The method includes: the RRU sends a detection signal to the base station antenna through antenna port j; the RCU controls the switch circuit Ki to be disconnected and another switch circuit to be connected; the RRU detects whether energy Qi obtained by the Ti is greater than a threshold; and the RRU determines whether the antenna port j of the RRU is connected to the port i of the base station antenna according to whether Qi is greater than the threshold.

14 Claims, 7 Drawing Sheets

(56) References Cited

FOREIGN PATENT DOCUMENTS

| | | |
|---|---|---|
| IN | 102571239 A | 7/2012 |
| JP | 2016220039 A | 12/2016 |

\* cited by examiner

CABLE SEQUENCE DETECTION METHOD AND DETECTION SYSTEM

CROSS-REFERENCE TO RELATED APPLICATIONS

This application is a continuation of International Application No. PCT/CN2019/107864, filed on Sep. 25, 2019, the disclosure of which is hereby incorporated by reference in its entirety.

TECHNICAL FIELD

The embodiments relate to the field of communications technologies, and in particular, to a cable sequence detection method and a detection system for detecting a connection relationship when ports between a remote radio unit (RRU) and a base station antenna are connected through radio frequency cables.

BACKGROUND

In a base station architecture including a baseband unit (BBU), an RRU, and a base station antenna, the RRU is connected to the base station antenna through a radio frequency jumper, and when a base station is established, RRU ports are in a one-to-one correspondence with base station antenna ports. In a receiving direction, the RRU receives a signal from the base station antenna and sends the signal to the BBU. In a sending direction, the RRU receives a signal from the BBU, processes the signal, and then sends a processed signal through the base station antenna.

Figure 1A:
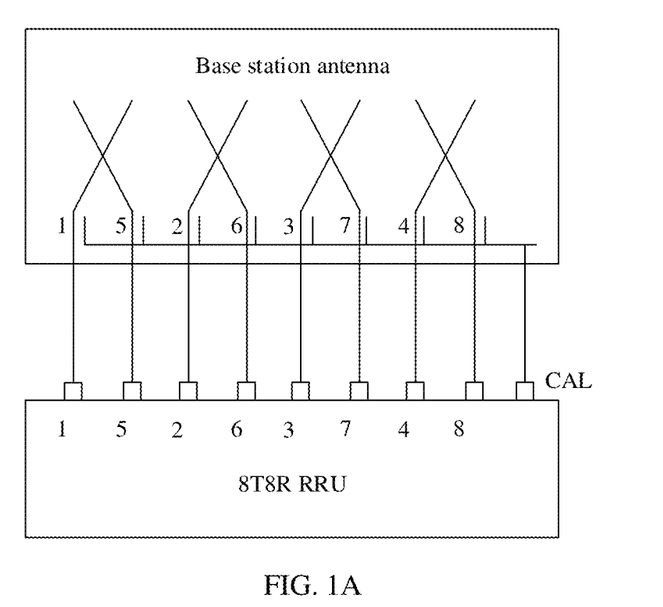
FIG. 1A is a schematic diagram of a case in which ports between an 8T8R RRU and a base station antenna are correctly connected in the conventional technology.
Figure 1B:
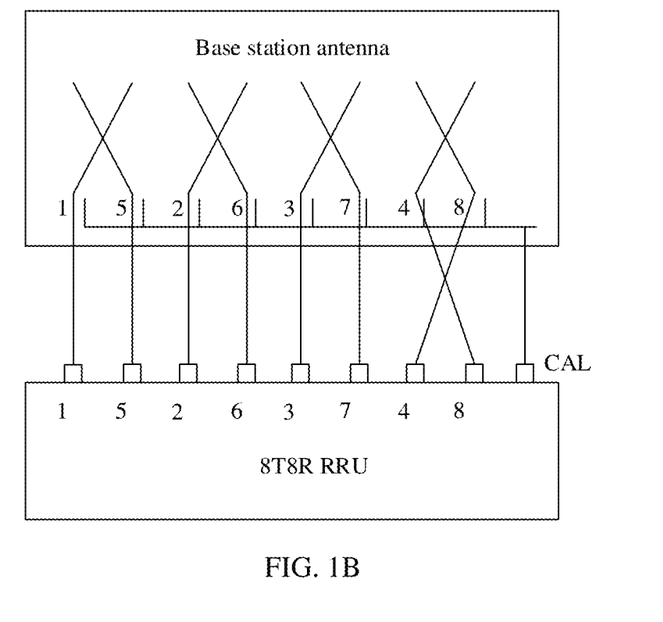
FIG. 1B is a schematic diagram of a case in which ports between an 8T8R RRU and a base station antenna are incorrectly connected in the conventional technology.

An 8 transmit 8 receive (8T8R) RRU is used as an example. The 8T8R RRU includes eight antenna ports (an ANT 0 to an ANT 7) and one antenna calibration port (CAL). The 8T8R RRU is connected to the base station antenna through nine radio frequency jumpers, and the nine radio frequency jumpers include eight service jumpers and one calibration jumper. Because there are a relatively large quantity of radio frequency jumpers, a misoperation may occur during engineering installation, resulting in an incorrect cable sequence connection of the radio frequency jumpers. Refer to FIG. 1A. In a normal case, the eight antenna ports of the 8T8R RRU are sequentially connected to eight ports of the base station antenna. In addition, the calibration port CAL of the RRU is connected to a calibration port of the base station antenna. In some possible implementations, the calibration port of the RRU is connected to the base station antenna through a directional coupler and a power splitter. Refer to FIG. 1B. Because of a misoperation, an antenna port 4 of the 8T8R RRU is connected to a port 8 of the base station antenna, and an antenna port 8 of the 8T8R RRU is connected to a port 4 of the base station antenna. Because there is an installation distance (which is usually 2.5 m to 10 m) between the base station antenna and the RRU, it is not easy to discover the incorrect cable sequence connection of the radio frequency jumpers.

During communication, especially in a 5th generation mobile communications standard, a beam scanning scheme is used for coverage, and a precise coverage and beamforming effect can be achieved only when the RRU ports and the corresponding base station antenna ports are connected in a one-to-one correspondence. Therefore, a connection cable sequence of the radio frequency jumpers between the base station antenna and the RRU is crucial to running and performance in 5th generation mobile communication.

SUMMARY

Embodiments may provide a cable sequence detection method and a detection system, to accurately detect a cable sequence of ports between an RRU and a base station antenna.

According to a first aspect, an embodiment provides a cable sequence detection method. A base station antenna includes N ports, and a remote radio unit RRU includes M antenna ports and one calibration port CAL. Any port i of the base station antenna corresponds to a directional coupling branch $T_i$, a switch circuit $K_i$ is disposed on the $T_i$, and connection and disconnection of the switch circuit $K_i$ are controlled by a remote control unit RCU. M, N, and i are integers, and $1 \leq i \leq N$. The M antenna ports of the RRU have been connected to the N ports of the base station antenna. The cable sequence detection method includes the following steps:

the RRU sends a detection signal to the base station antenna through any antenna port j;

the RCU controls the switch circuit $K_i$ to be disconnected, and controls another switch circuit to be connected;

the RRU detects whether energy $Q_i$ obtained during coupling by the directional coupling branch $T_i$ is greater than a threshold; and if $Q_i$ is greater than the threshold, the RRU determines that the antenna port j of the RRU is connected to the port i of the base station antenna; or if $Q_i$ is less than or equal to the threshold, the RRU determines that the antenna port j of the RRU is not connected to the port i of the base station antenna.

In this embodiment, after the ports between the RRU and the base station antenna are connected, whether any antenna port of the RRU is connected to any port of the base station antenna is determined. The RRU sends a detection signal to the base station antenna through the any antenna port. The RCU controls a switch circuit to disconnect a switch circuit corresponding to a to-be-detected channel, and controls another switch circuit to be connected. Then, whether an antenna port that is of the RRU and that corresponds to the to-be-detected channel is connected to a port of the base station antenna is determined based on energy obtained during coupling by a directional coupling branch corresponding to the to-be-detected channel. According to this method, a cable sequence of the ports between the RRU and the base station antenna can be accurately detected.

Based on the first aspect, in some possible implementations, the method further includes: detecting a connection relationship between each of the other N-1 ports than the port i of the base station antenna and the antenna port j of the RRU.

According to this embodiment, a connection relationship between the antenna port j of the RRU and the N ports of the base station antenna can be obtained.

Based on the first aspect, in some possible implementations, the method further includes: detecting a connection relationship between each of the other M-1 antenna ports than the antenna port j of the RRU and the N ports of the base station antenna.

According to this embodiment, a connection relationship between the M ports of the RRU and the N ports of the base station antenna can be obtained.

Based on the first aspect, in some possible implementations, the method further includes: generating a cable sequence connection diagram based on a connection relationship between each of the M antenna ports of the RRU and the N ports of the base station antenna.

When this embodiment is used, the cable sequence connection diagram may be displayed on a maintenance terminal with a display interface. A user can intuitively see a connection relationship between an antenna port of the RRU and a port of the base station antenna by observing the cable sequence connection diagram.

Based on the first aspect, in some possible implementations, that the RCU controls the switch circuit Ki to be disconnected, and controls another switch circuit to be connected includes: The RCU sends a control signal to each switch circuit of the base station antenna; and based on the control signal, controls the switch circuit Ki to be disconnected, and controls all the other switch circuits to be connected.

Based on the first aspect, in some possible implementations, the control signal may be a digit sequence used to indicate a high/low level.

When this embodiment is used, connection and disconnection of the switch circuit are controlled by using the digit sequence indicating a high/low level. For example, a digit sequence including 0 and 1 may be used as the control signal, 0 may be used to indicate a low level, and 1 may be used to indicate a high level. Further, 1 may alternatively be used to indicate a low level, and 0 may alternatively be used to indicate a high level, provided that the switch circuit Ki is disconnected and the another switch circuit is connected after control is performed by using the control signal.

In some possible implementations, the switch circuit Ki includes a PIN diode.

It should be noted that a common diode includes a PN junction. A thin light-doping intrinsic (I) semiconductor layer is added between P and N semiconductor materials, and a formed diode of this P-I-N structure is the PIN diode.

When this embodiment is used, after the RCU sends the control signal, connection or disconnection of the PIN diode is controlled by using the control signal.

According to a second aspect, an embodiment provides a detection system, including a base station antenna, a remote radio unit RRU, and a remote control unit RCU.

The RRU includes M antenna ports and one calibration port CAL.

The base station antenna includes N ports, any port i of the base station antenna corresponds to a directional coupling branch Ti, a switch circuit Ki is disposed on the Ti, connection and disconnection of the switch circuit Ki are controlled by the remote control unit RCU, M, N, and i are integers, and 1≤i≤N.

The RCU is configured to: control the switch circuit Ki to be disconnected and control another switch circuit to be connected.

The RRU is configured to: send a detection signal to the base station antenna through any antenna port j after the M antenna ports of the RRU have been connected to the N ports of the base station antenna; after the RCU controls the switch circuit Ki to be disconnected and controls the another switch circuit to be connected, detect whether energy Qi obtained during coupling by the directional coupling branch Ti is greater than a threshold; and if Qi is greater than the threshold, determine that the antenna port j of the RRU is connected to the port i of the base station antenna; or if Qi is less than or equal to the threshold, determine that the antenna port j of the RRU is not connected to the port i of the base station antenna.

In this embodiment, after the ports between the RRU and the base station antenna are connected, whether any antenna port of the RRU is connected to any port of the base station antenna is determined. The RRU sends a detection signal to the base station antenna through the any antenna port. The RCU controls a switch circuit to disconnect a switch circuit corresponding to a to-be-detected channel and controls another switch circuit to be connected. Then, whether an antenna port that is of the RRU and that corresponds to the to-be-detected channel is connected to a port of the base station antenna is determined based on energy obtained during coupling by a directional coupling branch corresponding to the to-be-detected channel. According to this method, a cable sequence of the ports between the RRU and the base station antenna can be accurately detected.

Based on the second aspect, in some possible implementations, the detection system is further configured to detect a connection relationship between each of the other N-1 ports than the port i of the base station antenna and the antenna port j of the RRU.

According to this embodiment, a connection relationship between the antenna port j of the RRU and the N ports of the base station antenna can be obtained.

Based on the second aspect, in some possible implementations, the detection system is further configured to detect a connection relationship between each of the other M-1 antenna ports than the antenna port j of the RRU and the N ports of the base station antenna.

According to this embodiment, a connection relationship between the M ports of the RRU and the N ports of the base station antenna can be obtained.

Based on the second aspect, in some possible implementations, the detection system further includes a maintenance terminal, and the maintenance terminal is configured to generate a cable sequence connection diagram based on a connection relationship between each of the M antenna ports of the RRU and the N ports of the base station antenna.

When this embodiment is used, the cable sequence connection diagram may be displayed on the maintenance terminal with a display interface. A user can intuitively see a connection relationship between an antenna port of the RRU and a port of the base station antenna by observing the cable sequence connection diagram.

Based on the second aspect, in some possible implementations, when controlling the switch circuit Ki to be disconnected and controlling the another switch circuit to be connected, the RCU is configured to: send a control signal to each switch circuit of the base station antenna; and based on the control signal, control the switch circuit Ki to be disconnected, and control all the other switch circuits to be connected.

Based on the second aspect, in some possible implementations, the control signal includes a digit sequence used to indicate a high/low level.

When this embodiment is used, connection and disconnection of the switch circuit are controlled by using the digit sequence indicating a high/low level. For example, a digit sequence including 0 and 1 may be used as the control signal, 0 may be used to indicate a low level, and 1 may be used to indicate a high level. Further, 1 may alternatively be used to indicate a low level, and 0 may alternatively be used to indicate a high level, provided that the switch circuit Ki is disconnected and the another switch circuit is connected after control is performed by using the control signal.

Based on the second aspect, in some possible implementations, the switch circuit Ki includes a PIN diode.

When this embodiment is used, after the RCU sends the control signal, connection or disconnection of the PIN diode is controlled by using the control signal.

BRIEF DESCRIPTION OF DRAWINGS

The following describes the accompanying drawings required for describing embodiments or the background.

DETAILED DESCRIPTION OF THE EMBODIMENTS

The following describes the solutions in embodiments with reference to the accompanying drawings in the embodiments. It is clear that the described embodiments are merely some but not all of the embodiments. A person of ordinary skill in the art may obtain other embodiments.

Terms used in embodiments are only used to explain embodiments, but are not intended to limit.

Figure 2A:
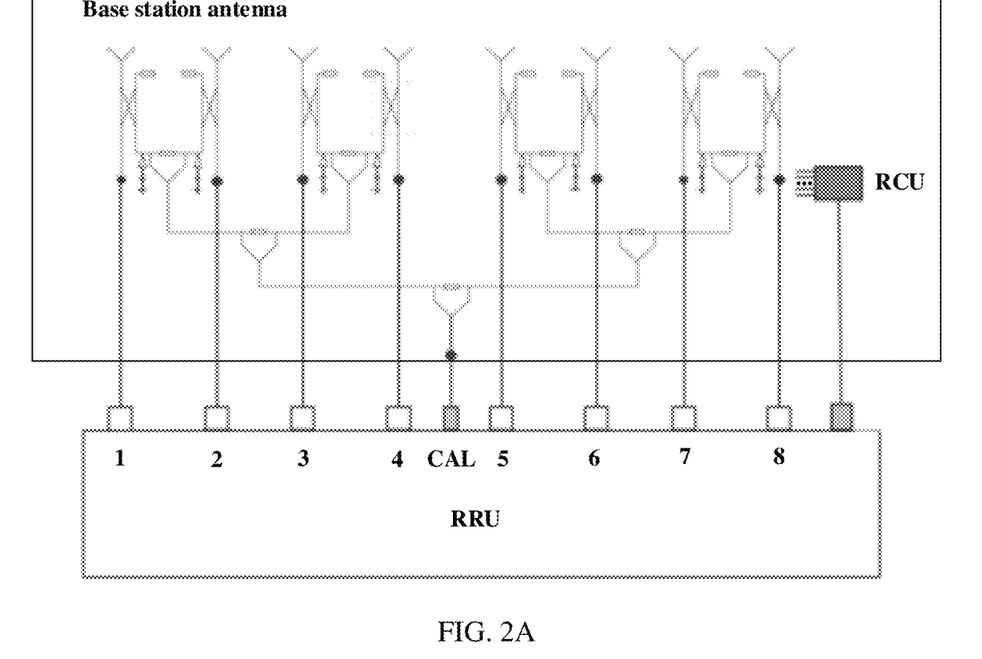
FIG. 2A is a schematic diagram of a connection between an RRU and a base station antenna according to an embodiment.
Figure 2B:
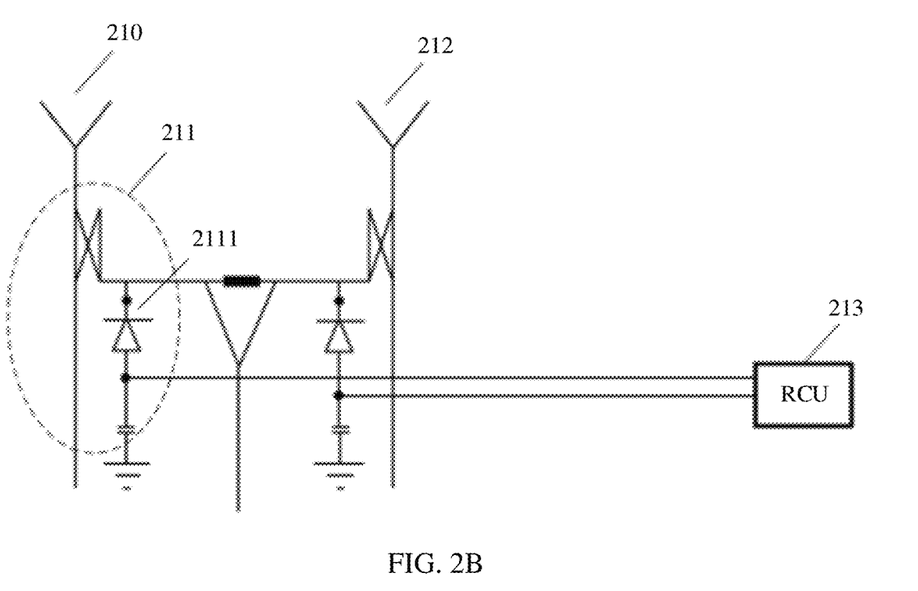
FIG. 2B is a schematic diagram of a connection structure between an RCU and a switch circuit according to an embodiment.
Figure 2C:
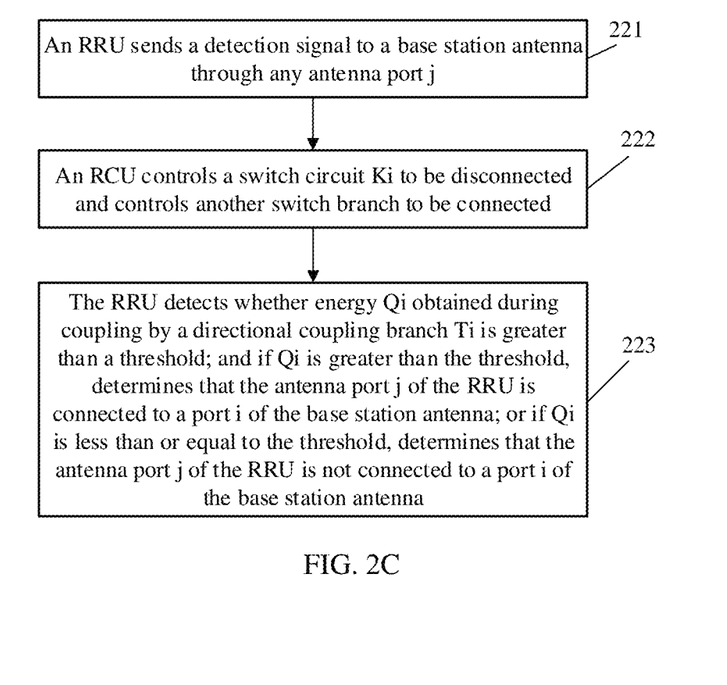
FIG. 2C is a schematic flowchart of a cable sequence detection method according to an embodiment.

An embodiment provides a cable sequence detection method, which may be applied to an apparatus shown in FIG. 2A. As shown in FIG. 2A, a base station antenna includes eight ports, and an RRU includes eight antenna ports and one CAL. It should be noted that a connection relationship between an RCU and each switch circuit is not shown in FIG. 2A. For the relationship between the RCU and each switch circuit, refer to FIG. 2B. Any port i 210 of the base station antenna corresponds to a directional coupling branch Ti 211, and a switch circuit Ki 2111 is disposed on the Ti. In FIG. 2B, the switch circuit is a PIN diode, and connection and disconnection of the switch circuit Ki are controlled by an RCU 213. The RCU 213 sends a control signal to each switch circuit of the base station antenna, to control the switch circuit Ki to be disconnected and control all the other switch circuits to be connected. In some possible implementations, the control signal may be a digit sequence used to indicate a high/low level. After the eight antenna ports of the RRU have been connected to the eight ports of the base station antenna, the cable sequence detection method for detecting a connection relationship is shown in FIG. 2C and includes the following steps.

221: The RRU sends a detection signal to the base station antenna through any antenna port j.

222: The RCU controls the switch circuit Ki to be disconnected and controls another switch circuit to be connected.

223: The RRU detects whether energy Qi obtained during coupling by the directional coupling branch Ti is greater than a threshold; and if Qi is greater than the threshold, determines that the antenna port j of the RRU is connected to the port i of the base station antenna; or if Qi is less than or equal to the threshold, determines that the antenna port j of the RRU is not connected to the port i of the base station antenna.

In this embodiment, after the ports between the RRU and the base station antenna are connected, whether any antenna port of the RRU is connected to any port of the base station antenna is determined. The RRU sends a detection signal to the base station antenna through the any antenna port. The RCU controls a switch circuit to disconnect a switch circuit corresponding to a to-be-detected channel and controls another switch circuit to be connected. Then, whether an antenna port that is of the RRU and that corresponds to the to-be-detected channel is connected to a port of the base station antenna is determined based on energy obtained during coupling by a directional coupling branch corresponding to the to-be-detected channel. According to this method, a cable sequence of the ports between the RRU and the base station antenna can be accurately detected.

An embodiment further provides a detection system, including a base station antenna, a remote radio unit RRU, and a remote control unit RCU. The RRU includes M antenna ports and one calibration port CAL. The base station antenna includes N ports. Any port i of the base station antenna corresponds to a directional coupling branch Ti, a switch circuit Ki is disposed on the Ti, and connection and disconnection of the switch circuit Ki are controlled by the remote control unit RCU. M, N, and i are integers, and 1≤i≤N. The RCU is configured to: control the switch circuit Ki to be disconnected and control another switch circuit to be connected. The RRU is configured to: send a detection signal to the base station antenna through any antenna port j after the M antenna ports of the RRU have been connected to the N ports of the base station antenna; after the RCU controls the switch circuit Ki to be disconnected and controls the another switch circuit to be connected, detect whether energy Qi obtained during coupling by the directional coupling branch Ti is greater than a threshold; and if Qi is greater than the threshold, determine that the antenna port j of the RRU is connected to the port i of the base station antenna; or if Qi is less than or equal to the threshold, determine that the antenna port j of the RRU is not connected to the port i of the base station antenna.

In some possible implementations, the detection system is further configured to detect a connection relationship between each of the other N-1 ports than the port i of the base station antenna and the antenna port j of the RRU.

In some possible implementations, the detection system is further configured to detect a connection relationship between each of the other M-1 antenna ports than the antenna port j of the RRU and the N ports of the base station antenna.

In some possible implementations, the detection system further includes a maintenance terminal.

The maintenance terminal is configured to generate a cable sequence connection diagram based on a connection relationship between each of the M antenna ports of the RRU and the N ports of the base station antenna.

In some possible implementations, when controlling the switch circuit Ki to be disconnected and controlling the another switch circuit to be connected, the RCU is configured to: send a control signal to each switch circuit of the base station antenna; and based on the control signal, control the switch circuit Ki to be disconnected, and control all the other switch circuits to be connected.

In some possible implementations, the control signal includes a digit sequence used to indicate a high/low level.

In some possible implementations, the switch circuit Ki includes a PIN diode.

Figure 3A:
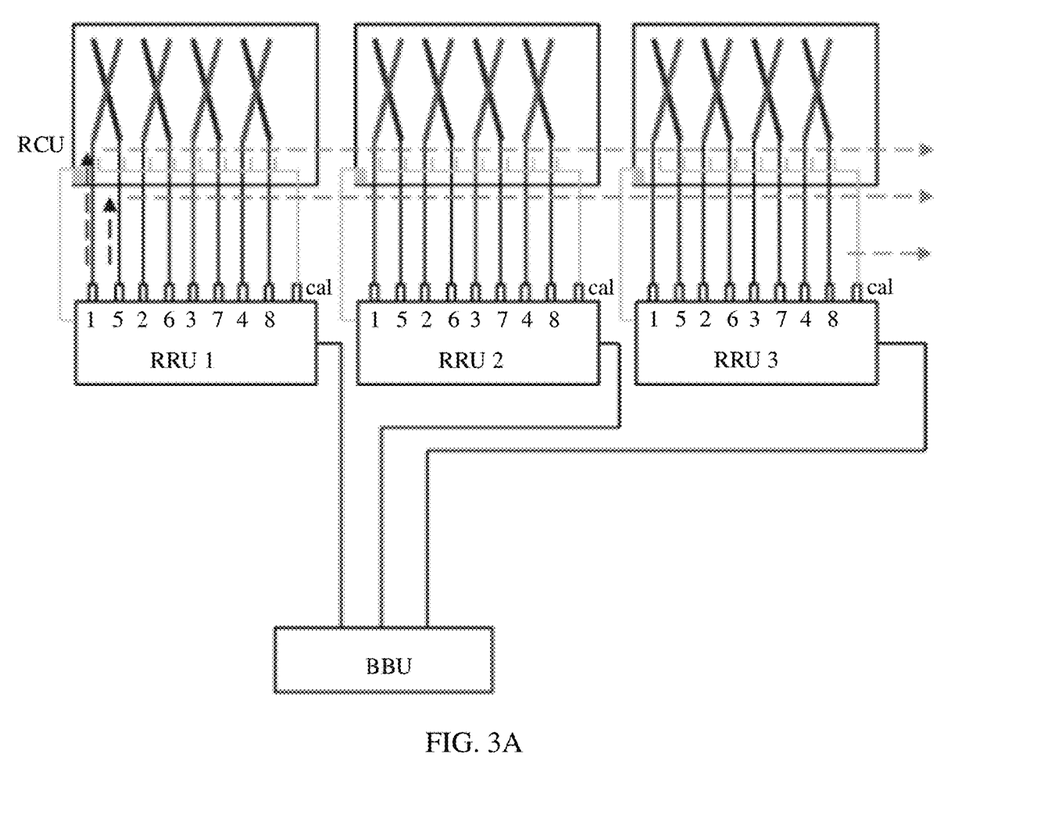
FIG. 3A is a schematic diagram of a structure of a cable sequence detection system according to an embodiment.
Figure 3B:
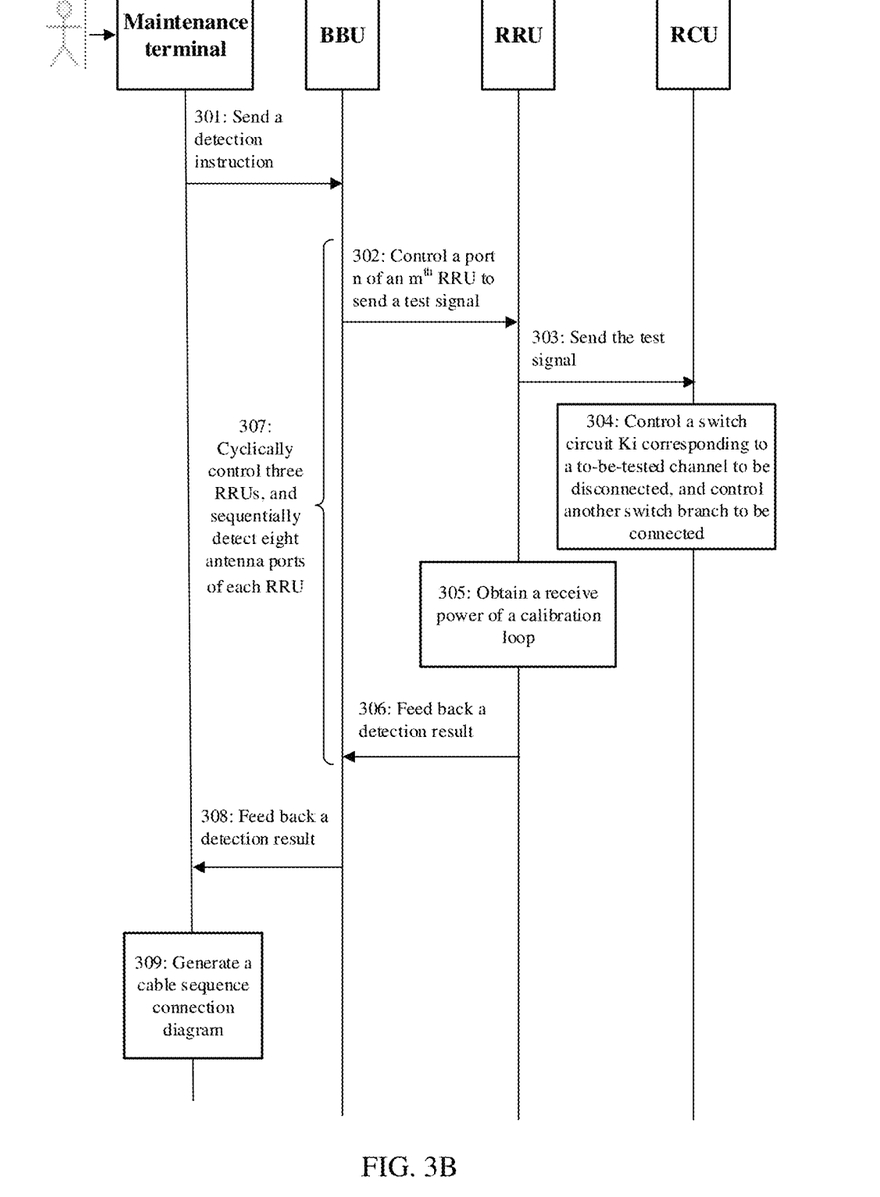
FIG. 3B is a schematic flowchart of interaction in a cable sequence detection method in the embodiment shown in FIG. 3A.

It should be noted that during cable sequence detection, the RRU is not limited to only one RRU, but there may be a plurality of RRUs. As shown in FIG. 3A, in this embodiment, there are three RRUs: an RRU 1, an RRU 2, and an RRU 3. Antenna ports of an RRU are in a one-to-one correspondence with ports of a base station antenna. FIG. 3A corresponds to a correct connection cable sequence. After the ports between the RRU and the base station antenna are connected, the connection cable sequence may be detected. FIG. 3B is a flowchart of interaction during cable sequence detection. Related hardware includes a maintenance terminal, a BBU, an RRU, an RCU, and the like. A cable sequence detection method in this embodiment includes the following steps.

301: A user sends a detection instruction to the BBU through the maintenance terminal.

The maintenance terminal may be a device such as a display that has a display interface. A button used to trigger the detection instruction may be disposed on the display interface. The user may trigger, by tapping the button of the detection instruction, to generate the detection instruction, and send the detection instruction to the BBU.

302: The BBU controls a port n of an $m^{th}$ RRU to send a test signal.

Herein, m may be 1, 2, or 3, and n may be any number from 1 to 8. In some possible implementations, traversal test may be performed on eight antenna ports in the RRU 1, then traversal test may be performed on eight antenna ports in the RRU 2, and finally traversal test may be performed on eight antenna ports in the RRU 3. It may be understood that an RRU test sequence may not be limited to the foregoing sequence but may alternatively be another possible sequence. This is not limited herein.

303: The RRU sends the test signal to the RCU.

304: The RCU controls a switch circuit Ki corresponding to a to-be-tested channel to be disconnected and controls another switch circuit to be connected.

305: The RRU obtains a receive power of a calibration loop.

306: The RRU feeds back a detection result.

It should be noted that the result fed back by the RRU may be information about a connection between an antenna port of the RRU and a port of the base station antenna or may be obtained power information. If Qi is greater than the threshold, it is determined that the antenna port j of the RRU is connected to the port i of the base station antenna. If Qi is less than or equal to the threshold, it is determined that the antenna port j of the RRU is not connected to the port i of the base station antenna.

307: Repeat step 302 to step 306, cyclically control the three RRUs, and sequentially detect eight antenna ports of each RRU.

308: The BBU feeds back the detection result to the maintenance terminal.

309: Generate a cable sequence connection diagram based on the detection result that is received.

Figure 3C:
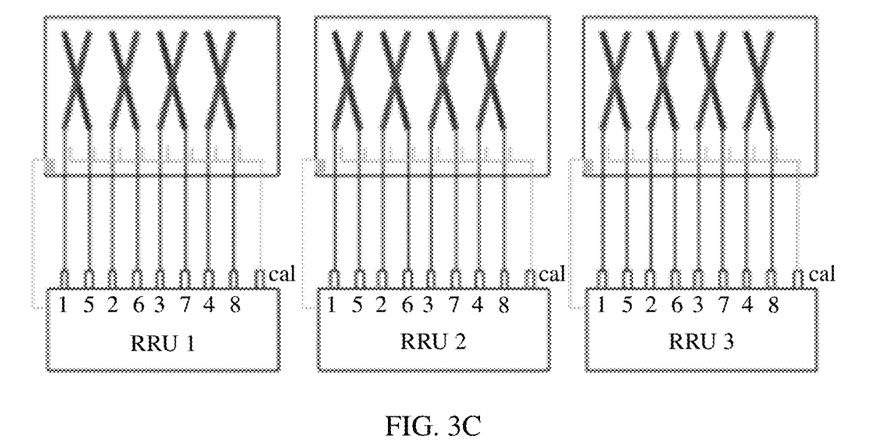
FIG. 3C is a schematic cable sequence connection diagram generated on a maintenance terminal according to an embodiment.
Figure 3D:
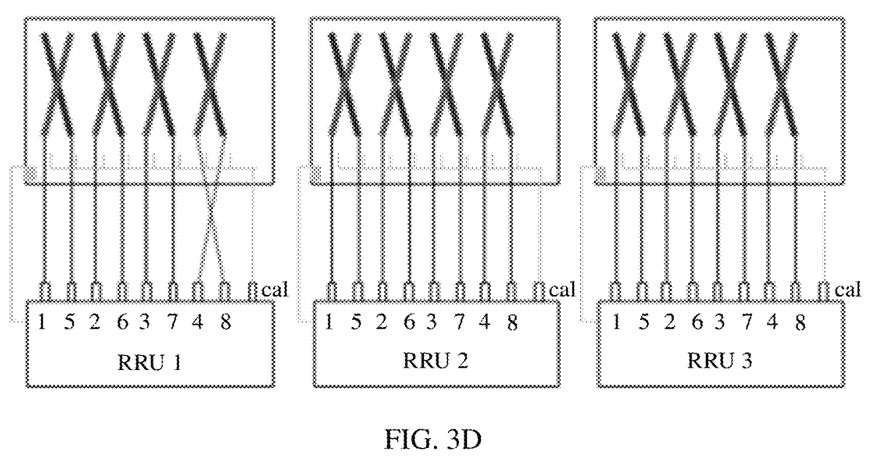
FIG. 3D is a schematic cable sequence connection diagram generated on a maintenance terminal according to an embodiment.
Figure 3E:
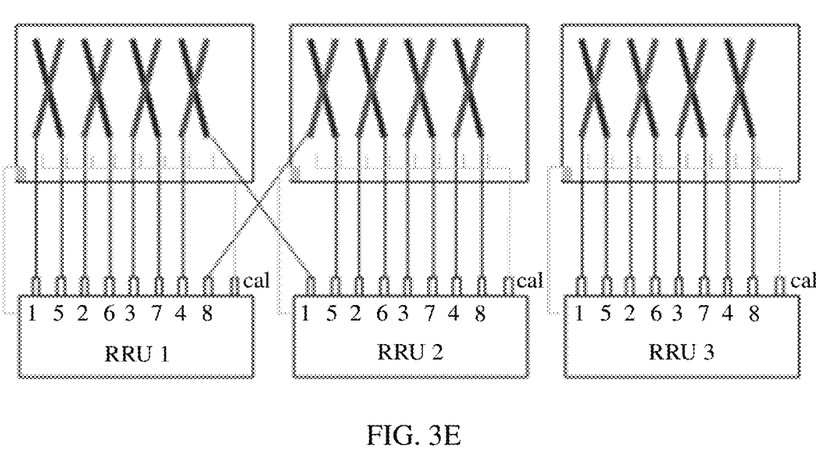
FIG. 3E is a schematic cable sequence connection diagram generated on a maintenance terminal according to an embodiment.

For example, FIG. 3C, FIG. 3D, and FIG. 3E correspond to cable sequence connection diagrams generated based on detection results in some embodiments.

A connection relationship between an antenna port of the RRU and a port of the base station antenna in a corresponding embodiment may be learned of by observing FIG. 3C, FIG. 3D, and FIG. 3E.

When this embodiment is used, the cable sequence connection diagram may be displayed on the maintenance terminal with the display interface. The user can intuitively see a connection relationship between an antenna port of the RRU and a port of the base station antenna by observing the cable sequence connection diagram.

It should be understood that the terms "include" and "have", and any variants thereof, are intended to cover non-exclusive inclusion. For example, a process, method, system, product, or device including a series of steps or modules is not necessarily limited to those clearly listed steps or modules but may include other steps or modules that are not clearly listed or are inherent to the process, method, product, or device.

What is described above is merely example embodiments, and is not intended to limit the protection scope. A person of ordinary skill in the art may understand that all or some of processes that implement the foregoing embodiment and equivalent modifications made shall fall within the scope of the embodiments.

What is claimed is:

1. A cable sequence detection method, wherein a base station antenna comprises N ports, a remote radio unit (RRU) comprises M antenna ports and one calibration port (CAL), any port i of the base station antenna corresponds to a directional coupling branch Ti, a switch circuit Ki is disposed on the Ti, connection and disconnection of the switch circuit Ki are controlled by a remote control unit (RCU), M, N, and i are integers, $1 \leq i \leq N$, the M antenna ports of the RRU have been connected to the N ports of the base station antenna, and the method comprises:

sending, by the RRU, a detection signal to the base station antenna through any antenna port j;

controlling, by the RCU, the switch circuit Ki to be disconnected, and controlling another switch circuit to be connected;

detecting, by the RRU, whether energy Qi obtained during coupling by the directional coupling branch Ti is greater than a threshold; and in response to Qi being greater than the threshold, determining that the antenna port j of the RRU is connected to the port i of the base station antenna; or in response to Qi being less than or equal to the threshold, determining that the antenna port j of the RRU is not connected to the port i of the base station antenna.

2. The cable sequence detection method according to claim 1, further comprising:

detecting a connection relationship between each of the other N-1 ports other than the port i of the base station antenna and the antenna port j of the RRU.

3. The cable sequence detection method according to claim 1, further comprising:

detecting a connection relationship between each of the other M-1 antenna ports other than the antenna port j of the RRU and the N ports of the base station antenna.

4. The cable sequence detection method according to claim 3, further comprising:

generating a cable sequence connection diagram based on a connection relationship between each of the M antenna ports of the RRU and the N ports of the base station antenna.

5. The cable sequence detection method according to claim 1, wherein the controlling, by the RCU, the switch circuit Ki to be disconnected, and controlling another switch circuit to be connected further comprises:

sending, by the RCU, a control signal to each switch circuit of the base station antenna; and based on the control signal;

controlling the switch circuit Ki to be disconnected; and controlling all the other switch circuits to be connected.

6. The cable sequence detection method according to claim 2, wherein the control signal comprises a digit sequence used to indicate a high/low level.

7. The cable sequence detection method according to claim 1, wherein the switch circuit Ki comprises a PIN diode.

8. A detection system comprising:

a base station antenna, a remote radio unit (RRU), and a remote control unit (RCU), wherein the RRU comprises M antenna ports and one calibration port (CAL); the base station antenna comprises N ports, any port i of the base station antenna corresponds to a directional coupling branch Ti, a switch circuit Ki is disposed on the Ti, connection and disconnection of the switch circuit Ki is controlled by the RCU, M, N, and i are integers, and 1≤i≤N, and the RCU is configured to:

control the switch circuit Ki to be disconnected, and control another switch circuit to be connected; and the RRU is configured to:

send a detection signal to the base station antenna through any antenna port j after the M antenna ports of the RRU have been connected to the N ports of the base station antenna;

after the RCU controls the switch circuit Ki to be disconnected and controls the another switch circuit to be connected, detect whether energy Qi obtained during coupling by the directional coupling branch Ti is greater than a threshold;

and in response to Qi being greater than the threshold, determine that the antenna port j of the RRU is connected to the port i of the base station antenna; or in response to Qi being less than or equal to the threshold, determine that the antenna port j of the RRU is not connected to the port i of the base station antenna.

9. The detection system according to claim 8, wherein the detection system is further configured to detect a connection relationship between each of the other N-1 ports other than the port i of the base station antenna and the antenna port j of the RRU.

10. The detection system according to claim 8, wherein the detection system is further configured to detect a connection relationship between each of the other M-1 antenna ports other than the antenna port j of the RRU and the N ports of the base station antenna.

11. The detection system according to claim 10, wherein the detection system further comprises:

a maintenance terminal configured to generate a cable sequence connection diagram based on a connection relationship between each of the M antenna ports of the RRU and the N ports of the base station antenna.

12. The detection system according to claim 8, wherein when controlling the switch circuit Ki to be disconnected and controlling the another switch circuit to be connected, the RCU is further configured to:

send a control signal to each switch circuit of the base station antenna; and based on the control signal, control the switch circuit Ki to be disconnected, and control all the other switch circuits to be connected.

13. The detection system according to claim 9, wherein the control signal comprises a digit sequence used to indicate a high/low level.

14. The detection system according to claim 8, wherein the switch circuit Ki comprises a PIN diode.

* * * * *